(12) United States Patent
Saito et al.

(10) Patent No.: US 7,129,018 B2
(45) Date of Patent: Oct. 31, 2006

(54) NEGATIVE PHOTORESIST COMPOSITIONS FOR THE FORMATION OF THICK FILMS, PHOTORESIST FILMS AND METHODS OF FORMING BUMPS USING THE SAME

(75) Inventors: Koji Saito, Kanagawa (JP); Kouichi Misumi, Kanagawa (JP); Toshiki Okui, Kanagawa (JP); Hiroshi Komano, Kanagawa (JP)

(73) Assignee: Toyko Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 11/258,274

(22) Filed: Oct. 26, 2005

(65) Prior Publication Data

US 2006/0035170 A1 Feb. 16, 2006

Related U.S. Application Data

(62) Division of application No. 10/147,984, filed on May 20, 2002, now Pat. No. 7,063,934.

(30) Foreign Application Priority Data

May 21, 2001 (JP) ............................. 2001-151131

(51) Int. Cl.
*G03F 7/038* (2006.01)

(52) U.S. Cl. .................................. 430/270.1; 430/910

(58) Field of Classification Search ...................... None
See application file for complete search history.

(56) References Cited

U.S. PATENT DOCUMENTS

| 2,754,279 A | 7/1956 | Hall et al. |
| 3,576,659 A | 4/1971 | Oliveri et al. |
| 3,634,082 A | 1/1972 | Christensen |
| 4,356,288 A * | 10/1982 | Lewis et al. ................. 525/308 |
| 4,506,006 A | 3/1985 | Ruckert |
| 4,888,379 A | 12/1989 | Henning et al. |
| 5,057,397 A | 10/1991 | Miyabe et al. |
| 5,227,276 A | 7/1993 | Roeschert et al. |
| 5,227,281 A | 7/1993 | Gaschler et al. |
| 5,494,777 A | 2/1996 | Shiraki et al. |
| 5,858,615 A | 1/1999 | Hawkins |
| 5,942,369 A | 8/1999 | Ota et al. |
| 5,965,319 A | 10/1999 | Kobayashi |
| 6,451,502 B1 | 9/2002 | Ray et al. |
| 6,641,972 B1 * | 11/2003 | Misumi et al. ............. 430/192 |
| 6,740,470 B1 * | 5/2004 | Tan et al. ................. 430/271.1 |

FOREIGN PATENT DOCUMENTS

| EP | 0 399 698 | 11/1990 |
| EP | 1 046 956 A1 | 10/2000 |
| GB | 1157738 | 7/1969 |
| JP | 10274853 A | 10/1998 |
| JP | 11-216965 A | 8/1999 |
| JP | 2000-250210 A | 9/2000 |
| KR | 2000-0076765 A | 12/2000 |

OTHER PUBLICATIONS

AN 1966:500694, CAPLUS, Entered in STN Apr. 22, 2001, ACS on STN, Abstract of FR 1434742 printed 1996, 1 pagen.*
Frye et al, "Investigation of photoresist and the photoresist/wafer interface with a local thermal probe," in Advances in Resist Technology and Processing XV, Will Conley, Editor, Proceedings of SPIE, vol. 333, pp. 1031-1039 (1998).
Cadogan et al, "Plasticizers; I. Introduction", Ullmann's Encyclopedia of Industrial Chemistry, Wiley-VCH Verlag GmbH & Co, KGaA, Article online positing date: Jun. 15, 2000, 3 pages at www.mrw.interscience.wiley.com/ueic/articles/a20_439/sect1.

* cited by examiner

*Primary Examiner*—Cynthia Hamilton
(74) *Attorney, Agent, or Firm*—Hoffmann & Baron, LLP

(57) ABSTRACT

A negative photoresist composition is used for the formation of thick films and includes (A) a novolak resin, (B) a plasticizer, (C) a crosslinking agent and (D) an acid generator. The composition is applied onto a substrate and thereby yields a photoresist film 5 to 100 μm thick. Likewise, the composition is applied onto a substrate of an electronic part, is patterned, is plated and thereby yields a bump.

6 Claims, No Drawings

NEGATIVE PHOTORESIST COMPOSITIONS FOR THE FORMATION OF THICK FILMS, PHOTORESIST FILMS AND METHODS OF FORMING BUMPS USING THE SAME

This is a divisional of application Ser. No. 10/147,984 filed May 20, 2002, now U.S. Pat. No. 7,063,934 the disclosure of which is incorporated herein by reference.

BACKGROUND OF THE INVENTION

1. Field of the Invention

The present invention relates to a negative photoresist composition for use in the formation of thick films, as well as to a photoresist film and a method of forming bumps using the photoresist film. Specifically, the invention relates to an alkali-developable negative photoresist composition for the formation of thick films which is suitable for photofabrication such as bump formation, wiring, interlayer insulating film formation, circuit protective film formation and processing and manufacture of precision parts, carried out when circuit substrates are manufactured and semiconductors and electronic parts are packaged on the circuit substrates.

2. Description of the Related Art

The photofabrication is a generic term for techniques in which a photosensitive resin composition is coated on the surfaces of process articles and the coating films formed are patterned by photolithography, followed by chemical etching or electrolytic etching using the patterns as masks, or electroforming chiefly using electroplating, any of which are applied alone or in combination, to fabricate various precision parts. This is prevalent in the current high-precision microfabrication techniques.

With the downsizing of electronic equipment, there are a rapid progress toward higher integration of LSIs and toward ASICs (application specific integrated circuits), and a demand for multipin thin-film packaging for mounting LSIs on electronic equipment, where the bare chip packaging carried out by the TAB system or flip-chip system, has attracted notice. In such multipin packaging, protruded electrodes of 20 µm or more in height, called bumps serving as connecting terminals, must be highly precisely arranged on the substrate, and it has become more required to make the bumps higher in precision so as to be adaptable to any further miniaturization of LSIs in future. In addition to the formation of the connecting terminals, a rewiring process is performed to form wiring between the chip and the connecting terminals in many cases. In this procedure, the wiring is patterned with the use of a thick resist film about 5 to about 20 µm in thickness.

Photoresists for the formation of thick films are used as materials for the formation of such bumps or for rewiring. The term "photoresist for the formation of thick films" (hereinafter referred to as "thick-film photoresist") used herein means and includes resists that can form films having a thickness of at least about 5 µm on substrates. Using such a patterned thick film as a mask, bumps are formed by plating process.

For example, Japanese Patent Laid-Open Nos. 10-207057, 2000-39709 and 2000-66386 disclose thick-film photosensitive resin compositions which are used for the formation of bumps or for wiring. These conventional thick-film photosensitive resin compositions require large amounts of reaction initiators in order to sufficiently react overall of the resulting resist films each having a large thickness. However, large amounts of reaction initiators may deteriorate compatibility or stability in preservation. Demands have therefore been made on reaction initiators having higher sensitivity.

Chemically amplified resists containing acid generators have been used as photosensitive resist compositions having high sensitivity. In these chemically amplified resists, a protonic acid is generated from the constitutive acid generator upon irradiation of active light or radiant ray and then induces an acid catalytic reaction with a base resin in the resin composition due to heat treatment after exposure. Thus, the chemically amplified resists have significantly higher sensitivity than conventional resists each having a photoreaction efficiency (a reaction per photon) of less than 1. As an example of chemically amplified negative resists, L. E. Bogan et al. disclose a resist using polyvinylphenol and a melamine derivative in combination in Proceeding of SPIE, 1086, 34–47 (1989). However, when thick films are formed using these chemically amplified resists, the resulting thick films invite cracking and do not exhibit required plating resistance.

SUMMARY OF THE INVENTION

Accordingly, an object of the present invention is to provide a negative photoresist composition for the formation of thick films, which has high sensitivity and satisfactory plating resistance, is suitable for the formation of thick films and is advantageous as a material for the formation of bumps, as well as to provide a photoresist film and a method of forming bumps using the photoresist film.

Specifically, the present invention provides, in one aspect, a negative photoresist composition for the formation of thick films. The composition includes (A) a novolak resin, (B) a plasticizer, (C) a crosslinking agent, and (D) an acid generator.

The ingredient (A) in the composition is preferably an alkali-soluble novolak resin.

The ingredient (B) is preferably an alkali-soluble acrylic resin.

Alternatively, the ingredient (B) may be an alkali-soluble vinyl resin.

In the composition, the ingredient (C) is preferably an alkoxymethylated amino resin.

The alkoxymethylated amino resin may be selected from methoxymethylated melamine resins, ethoxymethylated melamine resins, propoxymethylated melamine resins, butoxymethylated melamine resins and combinations thereof.

The ingredient (D) in the composition is preferably a triazine compound.

The present invention provides, in another aspect, a photoresist film being formed on a substrate by the application of the negative photoresist composition onto the substrate and having a thickness of from 5 to 100 µm.

In addition and advantageously, the present invention provides a method of forming bumps. The method includes the steps of applying the negative photoresist composition on a substrate of an electronic part to thereby form a resist film as a coating, irradiating the resist film with active light or radiant ray through a mask having a predetermined pattern, developing the exposed resist film, and plating portions from which the resist film has been removed.

Thus, the present invention provides a negative photoresist composition for the formation of thick films, which has high sensitivity and satisfactory plating resistance, is suitable for the formation of thick films and is advantageous as a material for the formation of bumps, as well as a photoresist film and a method of forming bumps using the photoresist film.

DETAILED DESCRIPTION OF THE INVENTION

The composition of the present invention will be described below.

Novolak Resins (A)

Novolak resins for use as the ingredient (A) in the present invention are preferably soluble in alkalis. Such novolak resins (A) can be obtained, for example, by addition condensation of aromatic compounds each having a phenolic hydroxyl group (hereinafter briefly referred to as "phenols") with aldehydes in the presence of acid catalysts. Such phenols for use herein include, but are not limited to, phenol, o-cresol, m-cresol, p-cresol, o-ethylphenol, m-ethylphenyl, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic esters, α-naphthol, and β-naphthol. The aldehydes include, but are not limited to, formaldehyde, paraformaldehyde, furfural, benzaldehyde, nitrobenzaldehyde, and acetaldehyde. Catalysts for use in the addition condensation are not specifically limited and include acid catalysts such as hydrochloric acid, nitric acid, sulfuric acid, formic acid, oxalic acid, and acetic acid.

The weight average molecular weight of the novolak resin (A) is not specifically limited but is preferably from 5000 to 30000.

The content of the ingredient (A) is preferably from 50 to 95 parts by weight and more preferably from 65 to 80 parts by weight relative to 100 parts by weight of the total amount of the ingredients (A), (B), (C) and (D). If the content of the ingredient (A) is less than 50 parts by weight, the resulting composition may induce deterioration in plating solution resistance, shapes of bumps and release property. In contrast, if it exceeds 95 parts by weight, the resulting composition may cause imperfect development upon developing.

Plasticizers (B)

Plasticizers for use as the ingredient (B) in the present invention include polymers each having an ethylenic double bond, of which acrylic polymers and vinyl polymers are preferred. The plasticizers (B) will be illustrated below by taking such an acrylic polymer or vinyl polymer as an example.

Of the ingredients (B) in the present invention, the acrylic polymers are preferably soluble in alkalis and each contain a constitutional unit derived from a polymerizable compound having an ether bond, or a constitutional unit derived from a polymerizable compound having a carboxyl group.

Such polymerizable compounds having an ether bond include, but are not limited to, 2-methoxyethyl (meth) acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and other (meth)acrylic acid derivatives each having an ether bond and an ester bond, as well as other radical-polymerizable compounds. Among them, 2-methoxyethyl acrylate and methoxytriethylene glycol acrylate are preferred. Each of these compounds can be used alone or in combination.

The polymerizable compounds having a carboxyl group include, but are not limited to, acrylic acid, methacrylic acid, crotonic acid, and other monocarboxylic acids; maleic acid, fumaric acid, itaconic acid, and other dicarboxylic acids; 2-methacryloyloxyethyl succinate, 2-methacryloyloxyethyl maleate, 2-methacryloyloxyethyl phthalate, 2-methacryloyloxyethyl hexahydrophthalate, and other methacrylic acid derivatives each having a carboxyl group and an ester bond. Among them, acrylic acid and methacrylic acid are preferred. Each of these compounds can be used alone or in combination.

The content of the polymerizable compound having an ether bond in the acrylic polymer is preferably from 30% to 90% by weight, and more preferably from 40% to 80% by weight. If the content exceeds 90% by weight, the acrylic resin may exhibit deteriorated compatibility with the novolak resin (A), and the resulting composition may cause Benard convection cells during prebaking and may fail to yield uniform resist films. The Benard cells are irregular pentagonal, hexagonal or heptagonal network patterns formed on the surface of the resist film due to gradient in gravity or surface tension. If the content is less than 30% by weight, the resist film may induce cracks during plating operation.

The content of the polymerizable compound having a carboxyl group in the acrylic polymer is preferably from 2% to 50% by weight, and more preferably from 5% to 40% by weight. If the content is less than 2% by weight, the acrylic resin may have decreased solubility in alkalis, the resulting resist film may not be satisfactorily developed, may not sufficiently be striped from the substrate and may remain on the substrate. If the content exceeds 50% by weight, the film residual rate after development and resistance to plating may be deteriorated.

The weight average molecular weight of the acrylic polymer is preferably from 10000 to 800000, and more preferably from 30000 to 500000. If the weight average molecular weight is less than 10000, the resist film may not have sufficient strength to thereby cause a bulged profile of the plated metal or cracking. If it exceeds 800000, the resist film may have deteriorated adhesion.

The acrylic polymer may further comprise an additional radical-polymerizable compound as a monomer in order to appropriately control the physical and chemical properties of the resulting composition. The term "additional radical-polymerizable compound" as used herein means and includes radical-polymerizable compounds other than the aforementioned polymerizable compounds. Such additional radical-polymerizable compounds include, but are not limited to, methyl (meth)acrylate, ethyl (meth)acrylate, butyl (meth)acrylate, and other alkyl esters of (meth)acrylic acid; 2-hydroxyethyl (meth)acrylate, 2-hydroxypropyl (meth) acrylate, and other hydroxy-substituted alkyl esters of (meth)acrylic acid; phenyl (meth)acrylate, benzyl (meth) acrylate, and other aryl esters of (meth)acrylic acid; diethyl maleate, dibutyl fumarate, and other diesters of dicarboxylic acids; styrene, α-methylstyrene, and other vinyl-group-containing aromatic compounds; vinyl acetate, and other vinyl-group-containing aliphatic compounds; butadiene, isoprene, and other conjugated diolefins; acrylonitrile, methacrylonitrile, and other nitrile-group-containing polymerizable compounds; vinyl chloride, vinylidene chloride, and other chlorine-containing polymerizable compounds; acrylamide, methacrylamide, and other amide-bond-containing polymerizable compounds. Each of these compounds can be used alone or in combination. Among them, n-butyl acrylate, benzyl methacrylate and methyl methacrylate are specifically preferred. The content of the additional radical-polymerizable compounds in the acrylic polymer is preferably less than 50% by weight and more preferably less than 40% by weight.

Polymerization solvents for use in the preparation of the acrylic polymers include, but are not limited to, ethanol, diethylene glycol, and other alcohols; ethylene glycol monomethyl ether, diethylene glycol monomethyl ether, diethylene glycol ethyl methyl ether, and other alkyl ethers of polyhydric alcohols; ethylene glycol ethyl ether acetate, propylene glycol methyl ether acetate, and other alkyl ether acetates of polyhydric alcohols; toluene, xylene, and other aromatic hydrocarbons; acetone, methyl isobutyl ketone, and other ketones; ethyl acetate, butyl acetate, and other esters, of which alkyl ethers of polyhydric alcohols and alkyl ether acetates of polyhydric alcohols are preferred.

Polymerization catalysts for use in the preparation of the acrylic polymers include conventional radical-polymerization initiators such as 2,2'-azobisisobutyronitrile and other azo compounds; benzoyl peroxide, di-tert-butyl peroxide, and other organic peroxides.

Alternatively, vinyl polymers are preferred as the ingredients (B) in the present invention. The term "vinyl polymer" as used herein means and includes polymers obtained from vinyl compounds.

Such vinyl polymers include, but are not limited to, poly(vinyl chloride), polystyrenes, polyhydroxystyrenes, poly(vinyl acetate), poly(vinyl benzoate), poly(vinyl alcohol), polyacrylic acid, polymethacrylic acid, polyacrylates, polymaleimide, polyacrylamide, polyacrylonitrile, polyvinylphenol and copolymers thereof.

Among these resins, resins having a carboxyl group or phenolic hydroxyl group in their side chain or principle chain are alkali-developable and are preferred. Among them, resins each having a carboxyl group are highly alkali-developable and are typically preferred. The weight average molecular weight of the vinyl polymer is preferably from 10000 to 200000 and more preferably from 50000 to 100000.

The content of the ingredient (B) in the composition of the present invention is preferably from 5 to 30 parts by weight, and more preferably from 10 to 20 parts by weight, relative to 100 parts by weight of the total amount of the ingredients (A), (B), (C) and (D). If the content of the ingredient (B) is less than 5 parts by weight, the resulting composition may exhibit deteriorated plating solution resistance and may cause insufficient adhesion and cracking of the resist film during plating operation. If it exceeds 30 parts by weight, the resulting resist film may have deteriorated strength, may yield insufficiently sharp profile due to bulging and may exhibit decreased definition.

Crosslinking Agents (C)

Crosslinking agents for use as the ingredient (C) in the present invention include, but are not limited to, amino compounds such as melamine resins, urea resins, guanamine resins, glycoluril-formaldehyde resins, succinamide-formaldehyde resins, and ethylene urea-formaldehyde resins. Among them, alkoxymethylated melamine resins, alkoxymethylated urea resins and other alkoxymethylated amino resins are preferred. The alkoxymethylated amino resins can be prepared, for example, in the following manner. Specifically, melamine or urea is allowed to react with formaldehyde in a boiling water to thereby yield a condensate, the condensate is then converted into an ether with a lower alcohol such as methyl alcohol, ethyl alcohol, propyl alcohol, butyl alcohol or isopropyl alcohol, and the resulting reaction mixture is cooled to thereby precipitate an alkoxymethylated amino resin. Examples of the alkoxymethylated amino resins are methoxymethylated melamine resins, ethoxymethylated melamine resins, propoxymethylated melamine resins, butoxymethylated melamine resins, methoxymethylated urea resins, ethoxymethylated urea resins, propoxymethylated urea resins, and butoxymethylated urea resins. Each of these alkoxymethylated amino resins can be used alone or in combination. Among them, alkoxymethylated melamine resins can stably pattern resists with less changes in dimensions of the patterned resists with changes in dose of the active light or radiant ray and are preferred, of which methoxymethylated melamine resins, ethoxymethylated melamine resins, propoxymethylated melamine resins and butoxymethylated melamine resins are specifically preferred.

The content of the ingredient (C) is preferably from 1 to 30 parts by weight and more preferably from 5 to 20 parts by weight relative to 100 parts by weight of the total amount of the ingredients (A), (B), (C) and (D). If the content of the ingredient (C) is less than 1 part by weight, the resulting thick film may have deteriorated plating resistance, chemical resistance and adhesion or the resulting bumps may have deteriorated shapes. In contrast, if it exceeds 30 parts by weight, the resist film may not satisfactorily developed upon developing procedure.

Acid Generators (D)

Acid generators for use as the ingredient (D) in the present invention are not specifically limited as long as they can directly or indirectly generate an acid upon irradiation of light or radiant ray. Such acid generators include, but are not limited to, 2,4-bis(trichloromethyl)-6-[2-(2-furyl)ethenyl]-s-triazine, 2,4-bis(trichloromethyl)-6-[2-(5-methyl-2-furyl) ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl) ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl) ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl) ethenyl]-s-triazine, 2,4-bis(trichloromethyl)-6-(3,4-methylenedioxyphenyl)-s-triazine, 2,4-bis(trichloromethyl)-6-(3-bromo-4-methoxy)phenyl-s-triazine, 2,4-bis(trichloromethyl)-6-(2-bromo-4-methoxy)phenyl-s-triazine, 2,4-bis(trichloromethyl)-6-(2-bromo-4-methoxy)styrylphenyl-s-triazine, 2,4-bis(trichloromethyl)-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4, 6-bis(trichloromethyl)-1,3,5-triazine, 2-[2-(2-furyl) ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis (trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis (trichloromethyl)-1,3,5-triazine, tris(1,3-dibromopropyl)-1, 3,5-triazine, tris(2,3-dibromopropyl)-1,3,5-triazine, and other halogen-containing triazine compounds; tris(2,3-dibromopropyl)isocyanurate and other halogen-containing triazine compounds represented by the following formula:

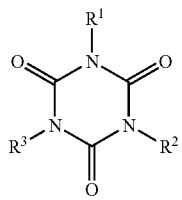

wherein $R^1$, $R^2$ and $R^3$ are the same or different and are each a halogenated alkyl group; α-(p-toluenesulfonyloximino)-phenylacetonitrile, α-(benzenesulfonyloximino)-2,4-dichlorophenylacetonitrile, α-(benzenesulfonyloximino)-2,6-dichlorophenylacetonitrile, α-(2-chlorobenzenesulfonyloximino)-4-methoxyphenylacetonitrile, α-(ethylsulfonyloximino)-1-cyclopentenylacetonitrile; and compounds represented by the following formula:

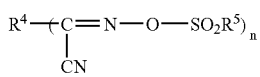

wherein $R^4$ is a monovalent, divalent or trivalent organic group; $R^5$ is a substituted or unsubstituted saturated hydrocarbon group, unsaturated hydrocarbon group or aromatic compound group; and n is a natural number of from 1 to 3. The term "aromatic compound group" as used herein means and includes groups of compounds exhibiting physical and chemical properties specific to aromatic compounds, such as phenyl group, naphthyl group and other aromatic hydrocarbon groups; and furyl group, thienyl group and other heterocyclic groups. These groups may each have one or more appropriate substituents on their rings. Such substituents include, for example, halogen atoms, alkyl groups, alkoxy groups and nitro group. As the group $R^5$ preferred are lower alkyl groups each containing from 1 to 4 carbon atoms, such as methyl group, ethyl group, propyl group and butyl group. Among these compounds, compounds in which $R^4$ is an aromatic compound group and $R^5$ is a lower alkyl group are preferred. When n is 1, examples of the acid generators represented by the formula are compounds of the formula wherein $R^4$ is any of phenyl group, methylphenyl group or methoxyphenyl group and $R^5$ is a methyl group, such as α-(methylsulfonyloximino)-1-phenylacetonitrile, α-(methylsulfonyloximino)-1-(p-methylphenyl)acetonitrile and α-(methylsulfonyloximino)-1-(p-methoxyphenyl)acetonitrile. Examples of the acid generators represented by the formula, wherein n is 2, are acid generators represented by the following formulae:

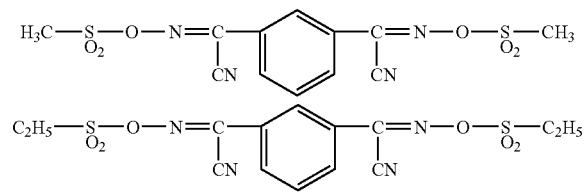

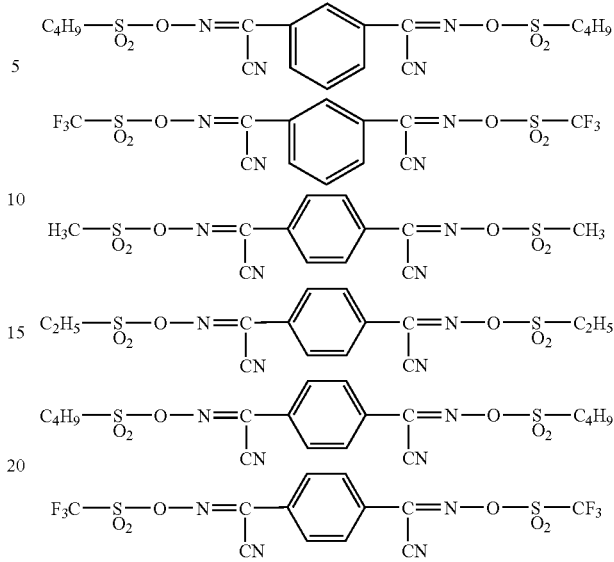

The acid generators also include, for example, bis(p-toluenesulfonyl)diazomethane, bis(1,1-dimethylethylsulfonyl)diazomethane, bis(cyclohexylsulfonyl) diazomethane, bis(2,4-dimethylphenylsulfonyl)diazomethane, and other bissulfonyldiazomethanes; 2-nitrobenzyl p-toluenesulfonate, 2,6-nitrobenzyl p-toluenesulfonate, nitrobenzyl tosylate, dinitrobenzyl tosylate, nitrobenzyl sulfonate, nitrobenzyl carbonate, dinitrobenzyl carbonate, and other nitrobenzyl derivatives; pyrogallol trimesylate, pyrogallol tritosylate, benzyl tosylate, benzyl sulfonate, N-methylsulfonyloxysuccinimide, N-trichloromethylsulfonyloxysuccinimide, N-phenylsulfonyloxymaleimide, N-methylsulfonyloxyphthalimide, and other sulfonic acid esters; diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl) diphenylsulfonium trifluoromethanesulfonate, (p-tert-butylphenyl)diphenylsulfonium trifluoromethanesulfonate, and other onium salts; benzoin tosylate, α-methylbenzoin tosylate, and other benzoin tosylates; and other diphenyliodonium salts, triphenylsulfonium salts, phenyldiazonium salts, and benzyl carbonate. Among these acid generators, triazine compounds exhibit high performances as acid generators which generate an acid upon irradiation with light, are highly soluble even when solvents are used and are preferred. Among them, bromine-containing triazine compounds are typically preferred, of which 2,4-bis(trichloromethyl)-6-(3-bromo-4-methoxy)phenyl-s-triazine, 2,4-bis (trichloromethyl)-6-(3-bromo-4-methoxy)styryl-s-triazine and tris(2,3-dibromopropyl)isocyanurate are specifically preferred.

The content of the ingredient (D) is preferably from 0.01 to 5 parts by weight, more preferably from 0.05 to 1 part by weight and specifically preferably from 0.1 to 0.5 part by weight relative to 100 parts by weight of the total amount of the ingredients (A), (B), (C) and (D). If the content of the ingredient (D) is less than 0.01 part by weight, the composition may not sufficiently be crosslinked and cured by heat or light and the resulting thick film may have deteriorated plating resistance, chemical resistance and adhesion or the resulting bumps may have deteriorated shapes. In contrast, if it exceeds 5 parts by weight, the composition may induce imperfect development upon developing procedure.

The thick-film photoresist composition of the present invention may further comprise an organic solvent for the adjustment of its viscosity. Such organic solvents include, but are not limited to, ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclohexanone, methyl propionate, ethyl propionate, propyl propionate, isopropyl propionate, methyl 2-hydroxypropionate, ethyl 2-hydroxypropionate, methyl 2-hydroxy-2-methylpropionate, methyl 3-methoxypropionate, ethyl 3-methoxypropionate, ethyl 3-ethoxypropionate, ethyl 3-propoxypropionate, propyl 3-methoxypropionate, isopropyl 3-methoxypropionate, ethyl ethoxyacetate, ethyl hydroxyacetate, methyl 2-hydroxy-3-methylbutanoate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, methanol, ethanol, propanol, butanol, hexanol, cyclohexanol, ethylene glycol, diethylene glycol and glycerol. Each of these solvents can be used alone or in combination.

In order to form films of at least 20 μm thick by spin coating the resultant negative photoresist composition, the solvent is preferably used in an amount that provides a solid matter concentration of less than or equal to 65% by weight. If the solid matter concentration exceeds 65% by weight, the composition may have so extremely poor fluidity that it can be handled with difficulty and moreover makes it difficult to obtain uniform resist films by spin coating.

Where necessary, the composition of the present invention may further comprise quenchers such as triethylamine, tributylamine, dibutylamine, triethanolamine, and other secondary or tertiary amines.

Optionally, the composition of the present invention may further comprise a surfactant to improve coating properties, defoaming properties, leveling properties and other properties. Such surfactants may be anionic, cationic or nonionic surfactants such as fluorine-containing surfactants commercially available under the trade names of BM-1000 and BM-1100 (available from BM Chemie GmbH); MEGAFAC F142D, MEGAFAC F172, MEGAFAC F173 and MEGAFAC F183 (available from Dainippon Ink & Chemicals, Incorporated); FLUORAD FC-135, FLUORAD FC-170C, FLUORAD FC-430 and FLUORAD FC-431 (available from Sumitomo 3M Limited); SURFRON S-112, SURFRON S-113, SURFRON S-131, SURFRON S-141 and SURFRON S-145 (available from Asahi Glass Co., Ltd.); SH-28PA, SH-190, SH-193, SZ-6032 and SF-8428 (available from Toray Silicone Co., Ltd.). The proportion of these surfactants is preferably less than or equal to 5 parts by weight relative to 100 parts by weight of the novolak resin (A).

To improve adhesion to the substrate, the composition of the present invention may effectively comprise an adhesive aid such as a functional silane coupling agent. The term "functional silane coupling agent" as used herein means and includes silane coupling agents each having a reactive substituent such as a carboxyl group, methacryloyl group, isocyanate group or epoxy group. Such functional silane coupling agents include, but are not limited to, trimethoxysilylbenzoic acid, γ-methacryloyloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane. The proportion of the adhesive aid is preferably less than or equal to 20 parts by weight relative to 100 parts by weight of the novolak resin (A).

To finely adjust the solubility to an alkali developing solution, the composition of the present invention may comprise an acid or acid anhydride and/or a high boiling solvent. Such acids or acid anhydrides include, but are not limited to, monocarboxylic acids such as acetic acid, propionic acid, n-butyric acid, iso-butyric acid, n-valeric acid, iso-valeric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringic acid; polyhydric carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid and 1,2,5,8-napthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bisanhydrotrimellitate and glycerol trisanhydrotrimellitate. Such high boiling solvents include, but are not limited to, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate. The amount of such a substance is not specifically limited and may be set in accordance with purposes and coating processes of the resulting composition, as long as the composition can be uniformly mixed. In general, the amount of the substance is preferably less than or equal to 60% by weight, and more preferably less than or equal to 40% by weight, based on the weight of the resulting composition.

The composition of the present invention may further comprise other additives such as a filler, a coloring agent and a viscosity modifier according to necessity. Such fillers include, but are not limited to, silica, alumina, talc, bentonite, zirconium silicate and powdered glass. The coloring agent includes, but is not limited to, extender pigments such as alumina white, clay, barium carbonate and barium sulfate; inorganic pigments such as zinc white, white lead, chrome yellow, red lead, ultramarine blue, iron blue, titanium oxide, zinc chromate, red iron oxide and carbon black; organic pigments such as Brilliant Carmine 6B, Permanent Red 6B, Permanent Red R, Benzidine Yellow, Phthalocyanine Blue and Phthalocyanine Green; basic dyes such as magenta and rhodamine; direct dyes such as Direct Scarlet and Direct Orange; and acid dyes such as Rhocerin and Metanil Yellow. The viscosity modifier includes, for example, bentonite, silica gel and powdered aluminum. These additives may be used in such an amount that they do not deteriorate the essential properties of the composition, and preferably less than or equal to 50% by weight based on the weight of the resulting composition.

The composition of the present invention may further comprise antifoaming agents and other additives according to necessity. Such antifoaming agents include, for example, silicone-containing or fluorine-containing antifoaming agents.

The composition of the present invention may be prepared by only mixing and stirring the materials according to a conventional procedure when the filler and the pigment are not used. When the filler and the pigment are used, the materials may be dispersed and mixed by means of a dispersion machine such as a dissolver, a homogenizer or a three-roll mill, further optionally followed by filtration using a mesh filter or a membrane filter.

The composition of the present invention is suitable for the formation of thick films and can also be used in, for example, protective films formed when various substrates such as copper, chromium, iron and glass substrates are etched, and resists for semiconductor fabrication.

When the composition of the present invention is used for the formation of a photoresist film, the thickness of the resulting film is from 5 to 100 μm, preferably from 5 to 40 μm, and more preferably from 20 to 30 μm.

Using the composition of the present invention as a resist film, bumps can be formed, for example, in the following manner.

(1) Formation of Coating: A solution of the composition prepared as described above is applied on a substrate having a predetermined wiring pattern to a thickness of 5 to 100 μm and preferably 20 to 40 μm, and the applied film is heated (prebaked) to remove the solvent to form a coating. To coat the composition on the substrate, a process such as spin coating, roll coating, screen printing or applicator coating may be employed. Prebaking conditions may differ depending on the types of the respective components in the composition, their mixing proportion and the coating layer thickness. Usually the prebaking may be carried out at 70° C. to 130° C., and preferably 80° C. to 120° C., for 2 to 60 minutes.

(2) Exposure to Radiant Rays: The coating thus formed is exposed to radiant rays such as ultraviolet rays or visible light rays of 300 to 500 nm in wavelength through a mask with a predetermined pattern, to expose the coating only at its wiring pattern areas on which bumps are to be formed. Such radiation sources include, for example, low-pressure mercury lamps, high-pressure mercury lamps, ultrahigh-pressure mercury lamps, metal halide lamps, and argon gas lasers. The radiant rays to which the coating is exposed are, for example, ultraviolet rays, visible light rays, far ultraviolet rays, X-rays and electron beams. Radiation dose may differ depending on the types of the respective components in the composition, their mixing proportion and the coating layer thickness. For example, when the ultrahigh-pressure mercury lamps are used, the radiation dose is from 100 to 2000 mJ/cm$^2$.

(3) Heating: After the exposure to radiant rays, the coating is heated according to a conventional procedure.

(4) Development: After heating, the pattern is developed by dissolving and removing the unexposed unnecessary areas, using an alkaline solution as a developing solution, to make only the radiation-exposed areas remain. As the developing solution, an aqueous solution of a basic compound may be used; the basic compound includes, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane. An aqueous solution prepared by adding to the aqueous solution of any of these basic compounds a water-soluble organic solvent, such as methanol or ethanol, or a surfactant may also be used as the developing solution.

Development time may differ depending on the types of the respective components in the composition, their mixing proportion and the dried coating thickness of the composition. Usually development may be carried out for 1 to 30 minutes, and may be carried out by any of dispensing development, dip development, puddle development and spray development. After the development, the substrate is rinsed with running water for 30 to 90 seconds, followed by air drying by means of an air gun or drying in an oven.

The plating process is not specifically limited, and any conventional plating processes can be used.

EXAMPLES

The present invention will be illustrated in further detail with reference to several examples and comparative examples below, which are not intended to limit the scope of the invention. All parts and percentages are by weight unless otherwise specified.

Synthesis Example 1

Synthesis of Alkali-Soluble Novolak Resin (A)

Sixty parts of m-cresol was added to forty parts of p-cresol, the resulting mixture was condensed with formaldehyde (as formalin) using an oxalic acid catalyst according to a conventional procedure and thereby yielded a cresol novolak resin. Low molecular weight fractions of the resin were removed by fractionation to yield an alkali-soluble novolak resin having a weight average molecular weight of 15000 (novolak resin A).

Synthesis Example 2

Synthesis of Alkali-Soluble Acrylic Resin (B)

The inside of a flask equipped with a stirrer, reflux condenser, thermometer and dropping funnel was replaced by nitrogen gas, and 200 g of propylene glycol methyl ether acetate as a solvent was placed in the flask, followed by stirring. Thereafter, the temperature of the solvent was raised to 80° C. Into the dropping funnel, 0.5 g of 2,2'-azobisisobutyronitrile as a polymerization initiator (available from Wako Pure Chemical Industries, Ltd. under the trade name of V-65), 130 g of 2-methoxyethyl acrylate, 50.0 g of benzyl methacrylate and 20.0 g of acrylic acid were charged, followed by stirring until the polymerization initiator dissolved. The resulting solution was uniformly dropped into the flask over 3 hours and was allowed to react at 80° C. for further five hours. The reaction mixture was then cooled to room temperature and thereby yielded an acrylic resin (alkali-soluble acrylic resin B).

Example 1

In 150 parts of propylene glycol methyl ether acetate were dissolved 75 parts of the novolak resin A, 15 parts of the alkali-soluble acrylic resin B, 10 parts of hexamethoxymethylated melamine (available from Sanwa Chemical Co., Ltd. under the trade name of Nikalac Mw-100) as a crosslinking agent (C) and 0.3 part of an acid generator (D) represented by the following formula, the resulting solution was filtrated using a membrane filter having a pore size of 1.0 μm and thereby yielded a negative photoresist composition. The properties of this composition were determined according to procedures mentioned later. The results are shown in Table 1.

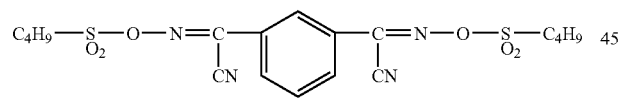

Example 2

A negative photoresist composition was prepared in the same manner as in Example 1, except that 70 parts of the novolak resin A and 20 parts of the alkali-soluble acrylic resin B were used. The properties of this composition were determined according to the procedures mentioned later. The results are shown in Table 1.

Example 3

A negative photoresist composition was prepared in the same manner as in Example 1, except that 80 parts of the novolak resin A and 10 parts of the alkali-soluble acrylic resin B were used. The properties of this composition were determined according to the procedures mentioned later. The results are shown in Table 1.

Example 4

A negative photoresist composition was prepared in the same manner as in Example 1, except that 15 parts of an alkali-soluble ethyl vinyl ether polymer obtained by subjecting ethyl vinyl ether to polymerization reaction in the presence of a catalyst in a gaseous phase at high temperature and high pressure was used as the plasticizer (B). The properties of this composition were determined according to the procedures mentioned later. The results are shown in Table 1.

Example 5

A negative photoresist composition was prepared in the same manner as in Example 1, except that 15 parts of an alkali-soluble methyl vinyl ether polymer obtained by subjecting methyl vinyl ether to polymerization reaction in the presence of a catalyst in a gaseous phase at high temperature and high pressure was used as the plasticizer (B). The properties of this composition were determined according to the procedures mentioned later. The results are shown in Table 1.

Comparative Example 1

A negative photoresist composition was prepared in the same manner as in Example 1, except that the ingredient (B) was not used. The properties of this composition were determined according to the procedures mentioned later. The results are shown in Table 2.

Comparative Example 2

A negative photoresist composition was prepared in the same manner as in Example 1, except that the crosslinking agent (C) and the acid generator (D) were not used and that 15 parts of a conventional photoreaction initiator, i.e., a photoreaction initiator obtained by allowing 1 mole of a compound represented by the following formula to react with 2 moles of 1,2-naphthoquinonediazido-4-sulfonyl chloride. The properties of this composition were determined according to the procedures mentioned below. The results are shown in Table 2.

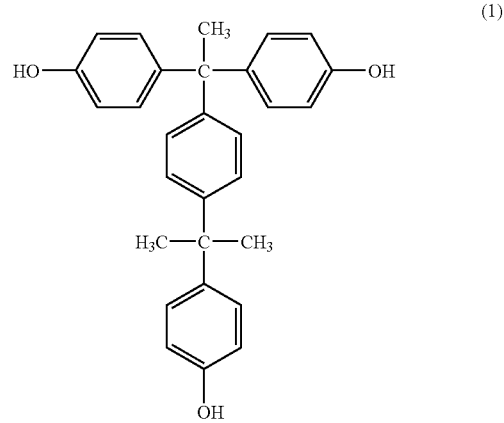

Determination of Properties
(i) Compatibility
A sample negative photoresist composition was stirred for 12 hours, and the state of the solution immediately after stirring and upon leaving for 12 hours after the completion of stirring was visually observed. How it stood as a dispersion was determined according to the following criteria:

Good: The composition was seen to have been uniformly dissolved immediately after stirring, and also seen to be in the uniformly dissolved state even after 12 hours.

Fair: The composition was seen to have been uniformly dissolved immediately after stirring, but seen to have caused phase separation after 12 hours.

Poor: The composition was not in the uniformly dissolved state even immediately after stirring.

(ii) Coating Property

The above negative photoresist composition used in the test (i) was coated on a 5 inch gold-sputtered silicon wafer by means of a spinner at 1000 rpm for 25 seconds, and the coating formed was heated at 110° C. for 6 minutes on a hot plate. The surface of the dry film was visually observed to determine coating property according to the following criteria:

Good: The film formed was free of unevenness and was uniform.

Poor: The film formed had unevenness such as pinholes and cissing.

(iii) Developing Property and Definition

The sample negative photoresist composition was coated on a 5-inch silicon wafer by means of a spinner at 1000 rpm for 25 seconds, and the coating formed was prebaked at 110° C. for 6 minutes on a hot plate and thereby yielded a coating about 20 μm thick. Next, through a patterned mask for measuring definition, the coating, which was formed on one sheet of coated substrate dividedly in three regions using a stepper (available from Ultratech under the trade name of Saturn Spectrum 3 Wafer Stepper), was exposed to ultraviolet rays at radiation doses ranging from 200 mJ/cm$^2$ to 2000 mJ/cm$^2$, respectively. The exposed substrate was heated at 110° C. for 6 minutes and was then subjected to development using a developing solution (available from Tokyo Ohka Kogyo Co., Ltd. under the trade name of PMER Series P-7G). The resulting film was rinsed with running water, followed by nitrogen blowing to yield a patternwise cured product. This was observed on an optical microscope to determine the definition according to the following criteria:

Good: A hole pattern of 5 μm square had been resolved at any of the above radiation doses and no residue was observed.

Poor: A hole pattern of 5 μm square had not been resolved or any residue was observed.

(iv) Plating Solution Resistance

The substrate having the patternwise cured product prepared in the above test (iii) was made into test materials. The test materials were subjected to ashing with oxygen plasma, was immersed in a non-cyanogen gold sulfite plating solution at 70° C. for 90 minutes, was then rinsed with running water and thereby yielded processed test materials. The processed test materials were observed on an optical microscope or an electron microscope to examine how the patternwise cured product stood, to determine the shape of the bumps and the plating solution resistance of the patternwise cured product according to the following criteria.

Good: The bumps and the patternwise cured product showed no particular changes.

Poor: Cracks, bulges or chips occurred in the patternwise cured product or the patternwise cured product had a rough surface.

(v) Bump Shape

Processed test materials were prepared in the same manner as in the test (iv) and were observed on an optical microscope or an electron microscope to examine the shapes of the bumps according to the following criteria:

Good: The shapes of the bumps were good and were in accordance with that of the patternwise cured product.

Poor: The shapes of the bumps were not in accordance with that of the patternwise cured product and induced bulging.

(vi) Releasability

The substrates each carrying the patternwise cured product obtained in the test (iii) were used as test materials, were immersed in a releasing agent (available from Tokyo Ohka Kogyo Co., Ltd. under the trade name of Stripper 710) at room temperature for 5 minutes with stirring, were rinsed with running water to thereby stripe the patternwise cured product. The resulting substrates were observed visually or on an optical microscope to examine the releasability of the patternwise cured product according to the following criteria:

Good: No residue of the patternwise cured product remained on the substrate.

Poor: The residue of the patternwise cured product remained on the substrate.

(vii) Photosensitivity

The sample negative photoresist composition was applied onto a 5-inch silicon wafer and thereby yielded a coating about 40 μm thick. Next, through a patterned mask for measuring definition, the coating, which was formed on one sheet of coated substrate dividedly in three regions using a stepper (available from Ultratech under the trade name of Saturn Spectrum 3 Wafer Stepper), was exposed to ultraviolet rays at doses ranging from 200 mJ/cm$^2$ to 10000 mJ/cm$^2$, respectively. The exposed substrate was then subjected to development using a developing solution (available from Tokyo Ohka Kogyo Co., Ltd. under the trade name of PMER Series P-7G). The resulting film was rinsed with running water, followed by nitrogen blowing to yield a patternwise cured product. This was observed on an optical microscope. In this procedure, the photosensitivity was defined as the dose at which a hole pattern of 5 μm square was resolved and no residue was observed.

TABLE 1

|  | Ex. 1 | Ex. 2 | Ex. 3 | Ex. 4 | Ex. 5 |
|---|---|---|---|---|---|
| Compatibility | Good | Good | Good | Good | Good |
| Coating property | Good | Good | Good | Good | Good |
| Developing property and definition | Good | Good | Good | Good | Good |
| Plating solution resistance | Good | Good | Good | Good | Good |
| Bump shape | Good | Good | Good | Good | Good |
| releasability | Good | Good | Good | Good | Good |
| Photosensitivity (mJ/cm$^2$) | 1000 | 1000 | 1000 | 1000 | 1000 |

TABLE 2

|  | Com. Ex. 1 | Com. Ex. 2 |
|---|---|---|
| Compatibility | Good | Good |
| Coating property | Good | Good |
| Developing property and definition | Good | Good |
| Plating solution resistance | Poor (cracks) | Good |
| Bump shape | Poor (creeping) | Good |

TABLE 2-continued

|  | Com. Ex. 1 | Com. Ex. 2 |
|---|---|---|
| Releasability | Good | Good |
| Photosensitivity (mJ/cm$^2$) | 1000 | 5000 |

The composition according to Comparative Example 2 had significantly deteriorated photosensitivity, although it stood comparison in the other properties with the compositions according to Examples 1 through 5.

Other embodiments and variations will be obvious to those skilled in the art, and this invention is not to be limited to the specific matters stated above.

What is claimed is:

1. A negative photoresist composition for the formation of thick films, comprising:
    (A) a novolak resin;
    (B) a plasticizer;
    (C) a crosslinking agent; and
    (D) an acid generator;
    wherein the composition is a composition for forming bumps by plating, and
    wherein the plasticizer is selected from acrylicpolymers containing constitutional unit derived from a polymerizable compound having an ether bond and a constitutional unit derived from a polymerizable compound having a carboxyl group.

2. The composition according to claim 1, wherein the ingredient (A) is an alkali-soluble novolak resin.

3. The composition according to claim 1, wherein the ingredient (C) is an alkoxymethylated amino resin.

4. The composition according to claim 3, wherein the alkoxymethylated amino resin is one selected from the group consisting of methoxymethylated melamine resins, ethoxymethylated melamine resins, propoxymethylated melamine resins, butoxymethylated melamine resins and combinations thereof.

5. The composition according to claim 1, wherein the ingredient (D) is a triazine compound.

6. A photoresist film being formed on a substrate by the application of the negative photoresist composition as claimed in claim 1 onto the substrate and having a thickness of from 5 to 100 μm.

* * * * *